(12) United States Patent
Raming et al.

(10) Patent No.: US 11,390,962 B2
(45) Date of Patent: Jul. 19, 2022

(54) SINGLE CRYSTAL OF SILICON WITH <100> ORIENTATION, WHICH IS DOPED WITH N-TYPE DOPANT, AND METHOD FOR PRODUCING SUCH A SINGLE CRYSTAL

(71) Applicant: SILTRONIC AG, Munich (DE)

(72) Inventors: Georg Raming, Tann (DE); Ludwig Stockmeier, Dresden (DE); Jochen Friedrich, Eckenhaid (DE); Matthias Daniel, Freiberg (DE); Alfred Miller, Emmerting (DE)

(73) Assignee: SILTRONIC AG, Munich (DE)

( * ) Notice: Subject to any disclaimer, the term of this patent is extended or adjusted under 35 U.S.C. 154(b) by 39 days.

(21) Appl. No.: 16/643,673

(22) PCT Filed: Aug. 28, 2018

(86) PCT No.: PCT/EP2018/073101
§ 371 (c)(1),
(2) Date: Mar. 2, 2020

(87) PCT Pub. No.: WO2019/042979
PCT Pub. Date: Mar. 7, 2019

(65) Prior Publication Data
US 2020/0270764 A1    Aug. 27, 2020

(30) Foreign Application Priority Data
Sep. 1, 2017    (DE) .......................... 102017215332.6

(51) Int. Cl.
*C30B 15/22*    (2006.01)
*C30B 15/20*    (2006.01)
*C30B 29/06*    (2006.01)

(52) U.S. Cl.
CPC ............ *C30B 15/22* (2013.01); *C30B 15/203* (2013.01); *C30B 15/206* (2013.01); *C30B 29/06* (2013.01)

(58) Field of Classification Search
CPC ..... C30B 15/20; C30B 15/203; C30B 15/206; C30B 15/22; C30B 29/06
See application file for complete search history.

(56) References Cited

U.S. PATENT DOCUMENTS 4,591,994 A * 5/1986 Washizuka .............. C30B 15/28
117/15
4,692,824 A   9/1987 Takahara et al.
(Continued)

FOREIGN PATENT DOCUMENTS

| EP | 1158075 A1 | 11/2001 |
| JP | 2003002780 A | 1/2003 |
| WO | 2016103987 A1 | 6/2016 |

OTHER PUBLICATIONS

G. Barinovs et al., "Numerical Study of Silicon Crystal Ridge Growth," Journal of Crystal Growth, 401 (2014) pp. 137-140.

*Primary Examiner* — Matthew J Song
(74) *Attorney, Agent, or Firm* — Brooks Kushman P.C.

(57) ABSTRACT

Single crystal silicon with <100> orientation is doped with n-type dopant and comprises a starting cone, a cylindrical portion and an end cone, a crystal angle being not less than 20° and not greater than 30° in a middle portion of the starting cone, the length of which is not less than 50% of a length of the starting cone, and edge facets extending from a periphery of the single crystal into the single crystal, the edge facets in the starting cone and in the cylindrical portion of the single crystal in each case having a length which is not more than 700 μm.

5 Claims, 6 Drawing Sheets

(56) References Cited

U.S. PATENT DOCUMENTS

| | | | | |
|---|---|---|---|---|
| 6,036,776 | A | * | 3/2000 | Kotooka .................. C30B 15/14 117/217 |
| 6,858,076 | B1 | * | 2/2005 | Nakajima ............... C30B 15/14 117/13 |
| 2002/0000188 | A1 | * | 1/2002 | Weber ..................... C30B 29/06 117/13 |
| 2015/0275392 | A1 | | 10/2015 | Soeta et al. |

* cited by examiner

SINGLE CRYSTAL OF SILICON WITH <100> ORIENTATION, WHICH IS DOPED WITH N-TYPE DOPANT, AND METHOD FOR PRODUCING SUCH A SINGLE CRYSTAL

CROSS REFERENCE TO RELATED APPLICATIONS

This application is the U.S. National Phase of PCT Appln. No. PCT/EP2018/073101 filed Aug. 28, 2018, which claims priority to German Application No. 10 2017 215 332.6 filed Sep. 1, 2017 the disclosures of which are incorporated in their entirety by reference herein.

BACKGROUND OF THE INVENTION

1. Field of the Invention

The subject matter of the invention is a single crystal of silicon with <100> orientation, which is doped with n-type dopant, and a method for producing such a single crystal. Semiconductor wafers are sliced from single crystals of this type and used as substrates for producing electronic components for power applications, for example, power MOSFETs. The single crystals required are usually pulled from a melt provided in a crucible by the CZ method.

2. Description of the Related Art

EP 1 158 075 A1 discloses, for example, that it is advantageous to pull the starting cone of the single crystal in such a way that its form is comparatively pointed. This measure reduces the frequency of events causing dislocations, which would lead to the termination of the growth of the monocrystalline crystal.

The influence that constitutional supercooling has on the formation of dislocations has also been investigated (J. Friedrich et al., ACTA PHYSICA POLONICA A No. 2, Vol. 124 (2013), pp. 219-226), and results of the investigation lead to the conclusion that it is advantageous to establish a higher temperature gradient, reduce the pulling rate and increase the convective transport of melt.

In US 2015/0275392 A1 it is reported that surface facets often appear on the starting cone before dislocations occur there.

The inventors of the present invention have addressed the problem of showing how the frequency of the formation of dislocations that make it necessary to abort pulling can be reduced further. The solution to the problem also comprises a single crystal with characteristic features.

SUMMARY OF THE INVENTION

The subject matter of the invention is therefore a single crystal of silicon with <100> orientation, which is doped with n-type dopant, comprising a starting cone, a cylindrical portion and an end cone, a crystal angle being not less than 20° and not greater than 30° in a middle portion of the starting cone, the length of the middle portion is not less than 50% of a length of the starting cone, and edge facets extending from a periphery of the single crystal into the single crystal, the edge facets in the starting cone and in the cylindrical portion of the single crystal in each case having a length which is not more than 700 μm.

DETAILED DESCRIPTION OF THE PREFERRED EMBODIMENTS

The single crystal is doped with phosphorus, arsenic or antimony or with a mixture of one or more of these dopants. The resistivity in the case of doping with phosphorus is preferably not more than 1.2 mΩcm, in the case of doping with arsenic is preferably not more than 3 mΩcm and in the case of doping with antimony is preferably not more than 30 mΩcm.

The single crystal, has in the cylindrical portion, a diameter preferably not less than 150 mm or not less than 200 mm, more preferably a diameter of not less than 300 mm.

Characteristic features of the single crystal are the crystal angle in the middle portion of the starting cone and the length of edge facets, in particular the length of those in the region of the starting cone. The starting cone can be divided into three portions, specifically into a first portion, in the course of which the crystal angle increases to the crystal angle of the second, middle portion, and a third portion, in the course of which the crystal angle decreases to the crystal angle of the cylindrical portion of the single crystal.

The crystal angle is the angle between the <100> direction, in which the single crystal grows, and a tangent to the periphery of the single crystal. Edge facets are facets along {111} planes, which extend from the periphery of the single crystal into the interior of the single crystal at a boundary angle to the tangent mentioned.

In the middle portion of the starting cone, the middle portion having length which is not less than 50%, preferably not less than 70% and more preferably not less than 90% of the length of the starting cone, the crystal angle is not less than 20° and not greater than 30°. The third portion of the starting cone (shouldering) has a length in the lower single-digit percentage range, for example 2%. The first portion of the starting cone of the single crystal has a length that corresponds virtually to the rest.

The inventors have found that dislocations originate at edge facets and that the length of the edge facets, in particular the length of those in the starting cone, is a critical parameter on which the frequency of the formation of dislocations depends. They conclude that the length of the edge facets should be not more than 700 μm in the starting cone and not more than 700 μm, preferably not more than 300 μm, in the cylindrical portion of the single crystal in order to solve the problem addressed.

For determining the length of the edge facets, the single crystal may be cut in {110} planes parallel to the direction of growth of the single crystal, to be precise in such a way that a typical growth line (ridge) of the single crystal is located in the middle of the detached tile-shaped sample (slab). One side of the sample is then ground, polished and preferably etched by means of preferential defect etching according to Secco (preferential etching) down to the center of the growth line. The length of the edge facets can subsequently be determined by inspection with an optical microscope. When doing so, it must be ensured that the measuring plane coincides with the center of the growth line (greatest measurable facet length), otherwise the facet length is wrongly measured too small.

The length of the edge facets can be influenced by the temperature gradient in the growing single crystal. It is all the shorter, the greater is the temperature gradient along the direction of extent of the edge facets. It is therefore preferred to work towards achieving the condition that that the phase boundary between the growing single crystal and the melt assumes a form on the basis of which this temperature gradient becomes as great as possible. That is the case when the angle of curvature between the direction of the pulling axis and the direction opposite to the direction of growth of the single crystal in the region of the periphery of the single crystal is 0° or less than 0°, most preferably −35.3°. The region of the periphery of the single crystal is the region that extends from the periphery radially into the single crystal up to a length of 0.1 mm.

It is preferred that the phase boundary, when pulling the middle portion and the third portion of the starting cone, has a form which, considered counter to the pulling axis, is concavely curved, w-shaped or planar. Such a form should also be aimed for when pulling the cylindrical portion of the single crystal, a concavely curved phase boundary being particularly preferred. In this case, the angle of curvature between the direction of the pulling axis and the direction opposite to the direction of growth of the single crystal in the region of the periphery of the single crystal is preferably less than 0°.

The subject matter of the invention is also a method for producing a single crystal from silicon with <100> orientation, comprising
doping a melt with n-type dopant;
pulling a starting cone, a cylindrical portion and an end cone of the single crystal by the CZ method;
pulling the starting cone with a crystal angle of not less than 20° and not more than 30° in a middle portion of the starting cone, the length of which is not less than 50% of a length of the starting cone, fluctuations of the crystal angle being limited by means of angle control to not more than 0.01°/s;
pulling the cylindrical portion of the single crystal at a pulling rate that is not more than 75% of a limit pulling rate, in the event of it being exceeded the deformation of the single crystal preventing continuation of the pulling; and
actively cooling the single crystal.

Particularly preferred is the pulling of the cylindrical portion of the single crystal at a pulling rate that is not more than 65% of the limit pulling rate.

Before pulling the single crystal, the melt is doped with phosphorus, arsenic, antimony or with a mixture of one or more of these dopants. Preferably, an amount of dopant sufficient to pull a single crystal of which the resistivity in the cylindrical portion of the single crystal in the case of doping with phosphorus is preferably not more than 1.2 mΩcm is provided, in the case of doping with arsenic preferably not more than 3 mΩcm, and in the case of doping with antimony preferably not more than 30 mΩcm.

The inventors have found that the linear growth of the edge facets depends particularly on the crystal angle and the temperature gradient at the phase boundary between the growing single crystal and the melt. In order to achieve the aim of limiting the linear growth of edge facets to the extent desired, the crystal angle should be not greater than 30°, and the region in the vicinity of the phase boundary should be actively cooled, preferably by means of a cooling device through which water flows for cooling, in particular even already during the pulling of the starting cone. The cooling rate in the temperature range from the melting point (1410° C.) of silicon to 1000° C. is preferably not less than 2 K/m in when pulling the cylindrical portion of a single crystal of silicon with a diameter of at least 300 mm.

These measures are not yet sufficient on their own, since the system reacts very sensitively to fluctuations of the crystal angle and temperature fluctuations in the region of the phase boundary. It is therefore also favorable for the pulling of the middle portion of the starting cone of the single crystal to be accompanied by angle control and to limit the pulling rate significantly when pulling the cylindrical portion of the single crystal.

A control based on the crystal angle is preferably used during the pulling of the middle portion of the starting cone up to the point in time at which the shouldering is begun. Such control is described for example in WO 00/60145 A1 and uses the crystal angle as a reference variable. Shouldering refers to the transitional phase during which the crystal angle of the starting cone is returned to the crystal angle of the cylindrical portion of the single crystal.

It is also preferred to pull the single crystal without angle control on the basis of a preconceived plan (controlled) during the shouldering. The control makes allowance for the pulling rate and the heating output of the crucible heating, and possibly the heating outputs of one or more additional heaters for heating the melt from above.

During the shouldering, the pulling rate should be not more than 1.5 mm/min. Preferably, the pulling rate is set to this value during shouldering. Instead of increasing the pulling rates beyond this limit, the heating output of the crucible heating and possibly the heating output of the one or more additional heaters may be increased.

During the pulling of the cylindrical portion of the single crystal, the pulling rate should be not more than 0.75 times, particularly preferably not more than 0.65 times, a limit pulling rate. The limit pulling rate is the maximum possible rate at which the single crystal can be pulled in the device used without the single crystal being deformed so much that it becomes impossible for pulling to be continued. If the position of the axis through the middle of the single crystal deviates from an intended position by more than 5 mm, it can be assumed that there is a deformation of the single crystal in the existence of which the pulling can no longer be continued. The limitation of the pulling rate serves the purpose of limiting temperature fluctuations in the region of the phase boundary.

As already mentioned, it is of advantage to ensure that the phase boundary during the pulling of the cylindrical portion of the single crystal has a form that is concavely curved. Preferably, the angle of curvature in the region of the periphery of the single crystal is less than 0°. For this purpose, the ratio of the rate of rotation of the single crystal and the rate of rotation of the crucible should preferably be not less than 2 and/or the melt should be exposed to a horizontal magnetic field or a CUSP magnetic field of preferably not less than 2500 Gauss.

The invention is further explained below with reference to drawings.

LIST OF THE DESIGNATIONS USED

1 Starting cone
2 Edge facet
3 Surface facet
4 Meniscus
5 Phase boundary

Figure 1:
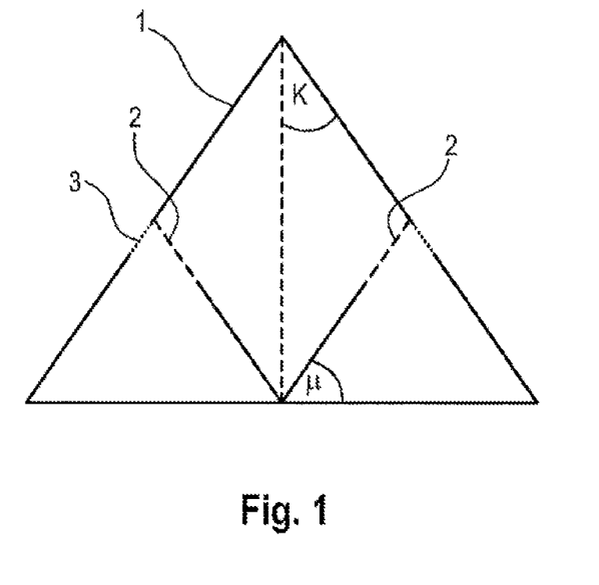
FIG. 1 serves for explaining the terms and shows a longitudinal section through the middle of a starting cone in a schematic form of representation.

A starting cone 1 with a crystal angle κ, as schematically represented in FIG. 1, typically has edge facets 2 and possibly surface facets 3. The edge facets 2 extend from the periphery of the starting cone 1 along {111} planes into the interior. The angle of intersection μ between a {111} plane and a plane perpendicular to the direction of growth of a single crystal with <100> orientation has the fixed value of 54.7°.

Figure 2:
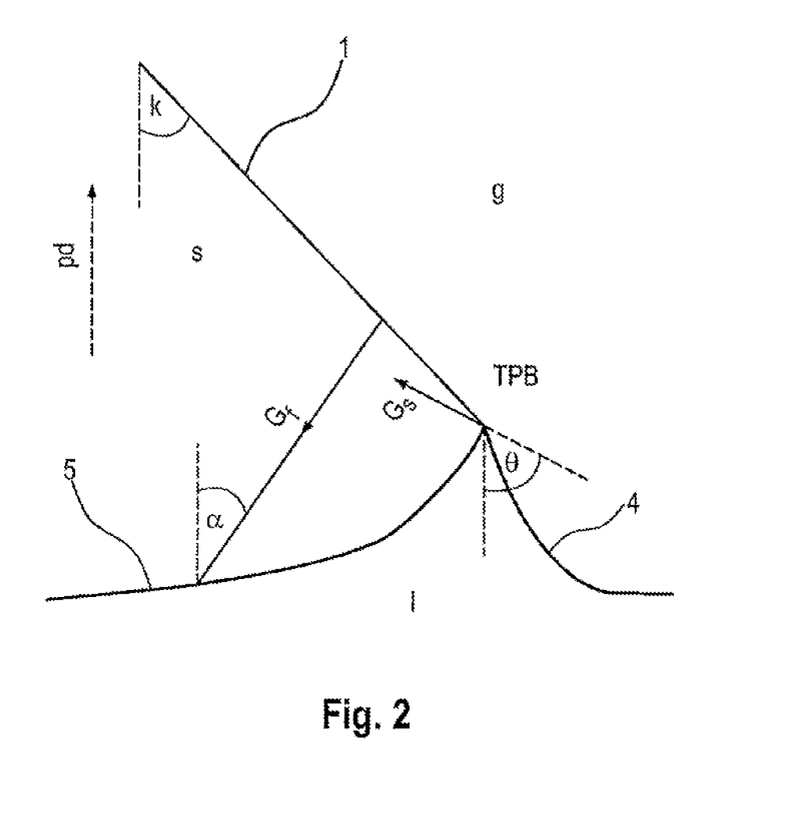
FIG. 2 schematically shows a partial section in the direction of growth through a growing starting cone.

FIG. 2 shows a starting cone 1 of a <100>-oriented single crystal of silicon, which grows at a phase boundary 5 with a melt. The phase boundary 5 extends to the periphery of the single crystal to a three-phase boundary TPB, where, at the upper end of a meniscus 4 of the melt, the liquid phase l, formed by the melt, the solid phase s, formed by the single crystal, and the gas phase g, formed by a surrounding atmosphere, meet one another. The profile of the phase boundary 5 also represents approximately the profile of an isotherm. Edge facets extend along a direction that forms an angle α of 35.3° with the direction of the pulling axis pd. The temperature gradient $G_f$ in the direction of extent of an edge facet should be as great as possible, to make the length of the edge facet as small as possible. Accordingly, the angle of curvature θ between the direction of the pulling axis and the direction of the temperature gradient $G_s$ at the periphery of the single crystal should be 0° or less than 0°, particularly preferably −35.3°. The temperature gradient $G_s$ extends from the phase boundary 5 at right angles into the single crystal and consequently has the direction opposite to the direction of growth of the single crystal. The temperature gradients $G_f$ and $G_s$ and also the angle of curvature θ relate to one another by way of the following equation:

$$G_s = \cos(35.3° + θ) \times G_f$$

Unlike the representation according to FIG. 2, the phase boundary 5 has as far as possible a form which, considered counter to the direction of the pulling axis, is concavely curved, w-shaped, virtually planar or planar. The crystal angle κ in a middle portion of the starting cone, the length of which is not less than 50% of a length of the starting cone, is not less than 20° and not more than 30°.

Figure 3:
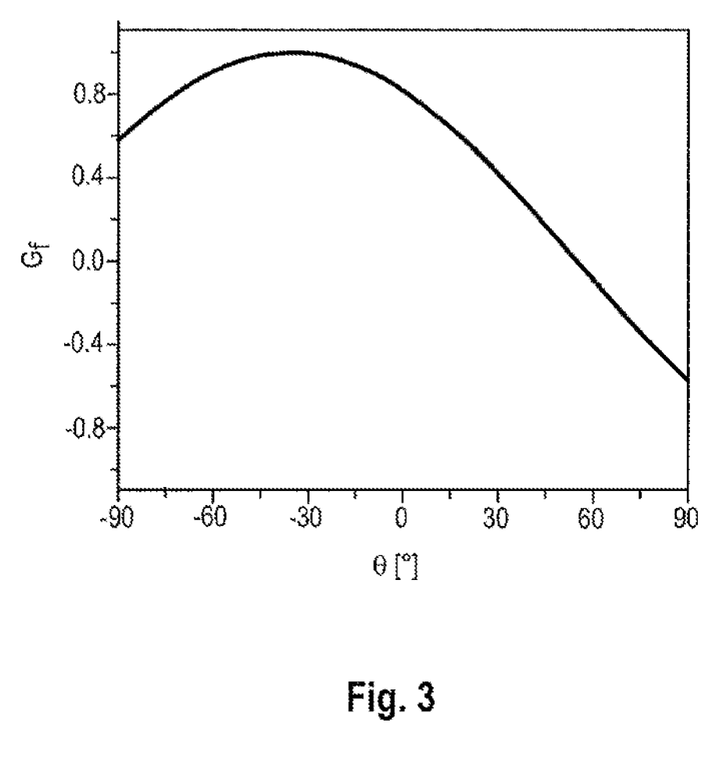
FIG. 3 shows a diagram in which the temperature gradient along the facet $G_f$ is plotted against the angle of curvature θ.

In FIG. 3, the temperature gradient $G_f$ is plotted against the angle of curvature θ. The temperature gradients $G_f$ and $G_s$ reach a maximum at θ=−35.3°.

Figure 4:
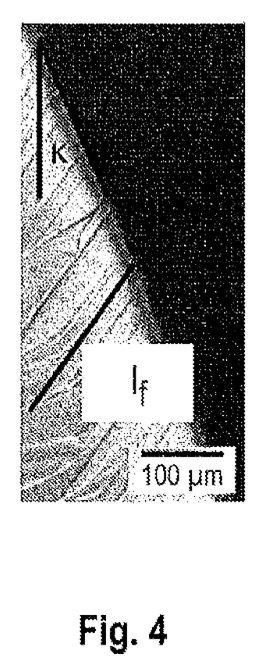
FIG. 4 shows part of a micrograph of a sample after preparation during inspection in an optical microscope.

A micrograph according to FIG. 4 can be used for determining the length of edge facets. It shows a part of the middle portion of a starting cone. Additionally depicted are the crystal angle κ and the length $l_f$ of an edge facet.

Figure 5:
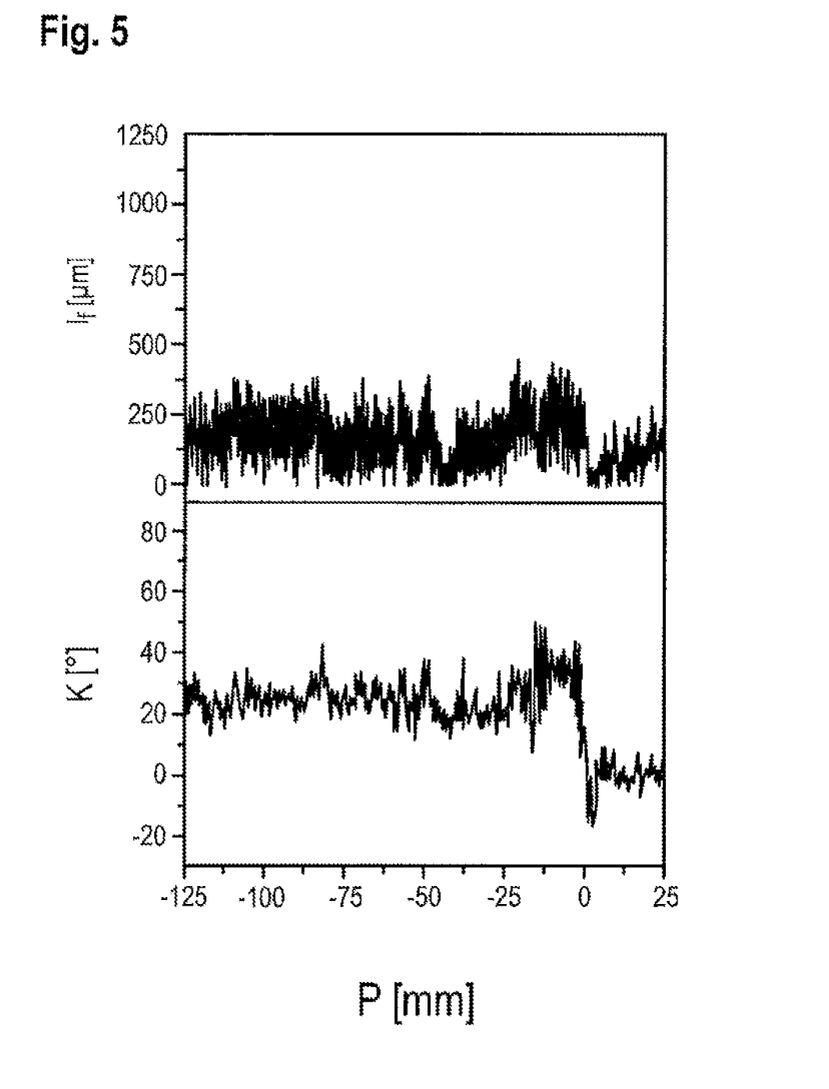
FIG. 5 and FIG. 6 show by an example according to the invention the profile of the crystal angle and the length of edge facets.
Figure 6:
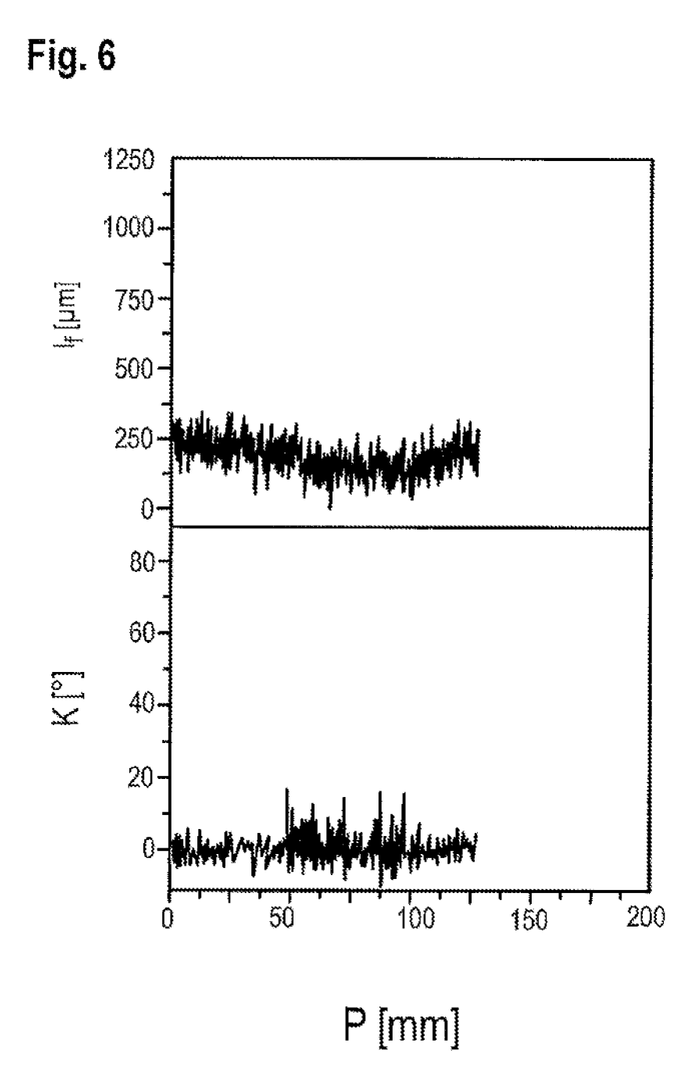

FIG. 5 and FIG. 6 show an example, according to the invention, the profile of the crystal angle κ and the length $l_f$ of edge facets from the beginning of the pulling of the middle portion of the starting cone at position P=−125 mm to the pulling of the first 25 mm of the cylindrical portion of the single crystal (FIG. 5) and the corresponding profile from the beginning of the pulling of the cylindrical portion (P=0 mm) to the pulling of the first 125 mm of the cylindrical portion of the single crystal (FIG. 6).

The invention claimed is:

1. A method for producing a silicon single crystal with <100> orientation, comprising:
    doping a melt of silicon with n-type dopant;
    pulling a starting cone, a cylindrical portion and an end cone of the single crystal by the CZ method;
    pulling the starting cone with a crystal angle of not less than 20° and not more than 30° in a middle portion of the starting cone, the length of which middle portion is not less than 50% of a length of the starting cone, fluctuations of the crystal angle being limited by means of angle control to not more than 0.01°/s;
    pulling the cylindrical portion of the single crystal at a pulling rate that is not more than 75% of a limit pulling rate, in the event of the limit pulling rate being exceeded, deformation of the single crystal prevents continuation of the pulling; and
    actively cooling the single crystal, including the starting cone, in a region in the vicinity of a phase boundary between the growing single crystal and the melt.

2. The method of claim 1, further comprising the pulling the single crystal in a transitional region between the starting cone and the cylindrical portion at a pulling rate of not more than 1.5 mm/min.

3. The method of claim 1, wherein cooling of the single crystal is achieved by means of a water cooling.

4. The method of claim 2, wherein cooling of the single crystal is achieved by means of a water cooling.

5. The method of claim 1, further comprising: slicing semiconductor wafers from the cylindrical portion of the single crystal.

* * * * *